United States Patent
Kobayashi et al.

[11] Patent Number: 6,022,461
[45] Date of Patent: *Feb. 8, 2000

[54] SPUTTERING APPARATUS

[75] Inventors: Masahiko Kobayashi, Kanagawa-ken; Nobuyuki Takahashi, Mitakashi, both of Japan

[73] Assignee: Anelva Corporation, Fuchu, Japan

[21] Appl. No.: 08/740,011

[22] Filed: Oct. 23, 1996

[30] Foreign Application Priority Data

Nov. 13, 1995 [JP] Japan .................................. 7-319477

[51] Int. Cl.[7] ................................................ C23C 14/34
[52] U.S. Cl. ........................ 204/298.07; 204/298.11; 204/298.19
[58] Field of Search ........................ 204/298.07, 298.11, 204/298.19

[56] References Cited

U.S. PATENT DOCUMENTS

| | | | |
|---|---|---|---|
| 4,094,764 | 6/1978 | Boucher et al. | 204/298.07 X |
| 4,988,422 | 1/1991 | Wirz | 204/298.07 X |
| 5,334,302 | 8/1994 | Kubo et al. | 204/298.07 X |
| 5,470,451 | 11/1995 | Kobayashi et al. | |
| 5,476,838 | 12/1995 | Wordenweber et al. | 204/298.07 X |
| 5,651,867 | 7/1997 | Kokaku et al. | 204/298.07 X |
| 5,770,025 | 6/1998 | Kiyota | 204/298.2 |

FOREIGN PATENT DOCUMENTS

| | | | |
|---|---|---|---|
| 2640078 | 6/1990 | France | 204/298.07 |
| 61-243167 | 10/1986 | Japan . | |
| 6-41739 | 2/1994 | Japan . | |
| 6-220627 | 8/1994 | Japan . | |
| 7-3450 | 1/1995 | Japan . | |
| 7-166348 | 6/1995 | Japan . | |
| 7-268624 | 10/1995 | Japan . | |

OTHER PUBLICATIONS

A300 Brochure; May, 1994.

*Primary Examiner*—Nam Nguyen
*Assistant Examiner*—Steven H. Ver Steeg
*Attorney, Agent, or Firm*—Burns, Doane, Swecker & Mathis, LLP

[57] ABSTRACT

A long distance sputtering apparatus is provided in which a target and a substrate are disposed so as to oppose each other in a vacuum vessel provided with an exhaust system, wherein the target and substrate are separated by a distance of 150 mm or more. The long distance sputtering apparatus includes a gas-introducing tube, a cylindrical shield, and an exhaust hole. The gas-introducing tube introduces gas from a location closer to the target than halfway between the target and the substrate. The shield is disposed so as to surround the space between the target and the substrate. The exhaust hole is formed closer to the substrate than the gas-introducing tube. The pressure distribution of the sputtering gas between the target and the substrate is characterized by a higher pressure toward the target and a lower pressure toward the substrate.

20 Claims, 7 Drawing Sheets

Prior Art

Prior Art

SPUTTERING APPARATUS

BACKGROUND OF THE INVENTION

1. Field of the Invention

The present invention relates to an apparatus for depositing a film onto the surface of a substrate by sputtering, and, more particularly, to a long distance sputtering apparatus in which the target and the substrate are separated by a larger distance than usual.

2. Description of the Related Art

Figure 6:
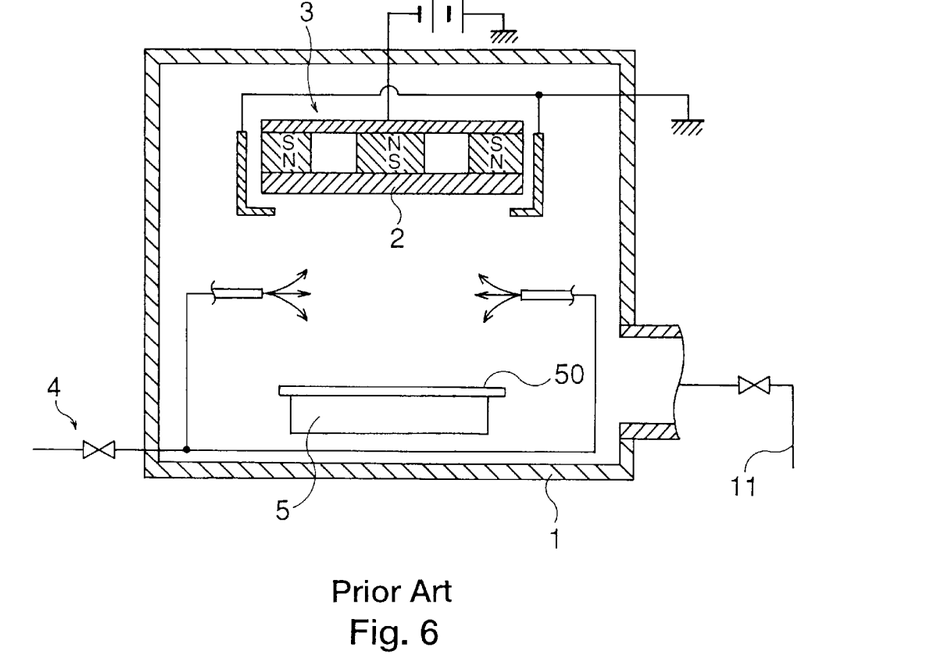
FIG. 6 is a front cross sectional view of a conventional sputtering apparatus.

A sputtering apparatus is widely used in the film deposition process of, for example, large-scale integrated circuits (LSIs), liquid crystal displays (LCDs), or information recording disks. FIG. 6 is a front cross section of a typical conventional sputtering apparatus. In such apparatus, a target 2, a magnetron electric discharge electrode 3, and a substrate holder 5 for holding a substrate 50 are provided in a vacuum vessel 1 provided with a gas-introducing mechanism 4 and an exhaust system 11.

Achieving improvements in step coverage, particularly in bottom coverage, is becoming very important in the field of semiconductor devices where the semiconductor devices are becoming increasingly densely integrated.

Step coverage refers to how well holes or grooves formed in the surface of a substrate, or a stepped section, are covered with a film. It is a term, including bottom coverage, that indicates the ratio of the film thickness at the bottom of a hole, groove, or stepped section to the film thickness at the top of a hole, groove, or stepped section.

As wiring becomes finer, the wiring width becomes narrower, on the one hand, and the height of the step (or depth of a hole or groove) becomes larger on the other, so that a sufficiently thick film can no longer be deposited at the bottom section of a deep hole or groove. For example, when a deposited barrier film is in a contact hole or through hole in the surface of a substrate by sputtering, and the barrier film deposited is not thick enough, mutual diffusion of atoms occurs between layers, resulting in junction leakage that may be fatal to the semiconductor devices.

Figure 7:
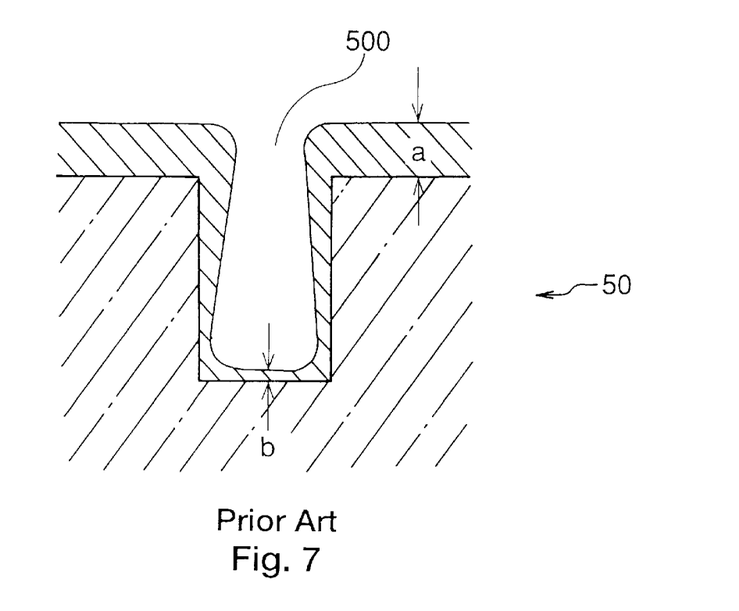
FIG. 7 is a cross sectional profile showing a film in a hole, deposited by means of the conventional sputtering apparatus.

Conventional sputtering apparatuses can only be used to deposit a film for a hole or groove having a width of up to 0.7 μm and an aspect ratio (equal to the height of the hole or the groove/width of the hole or groove) of up to about 1 to 2. This is because in conventional apparatuses, such as the one shown in FIG. 6, there are a large number of sputtering particles that are allowed to be obliquely incident to the substrate 50, so that only a small number of sputtering particles can reach the bottom of the hole or groove. This has been a technical obstacle to producing an integrated circuit of 16 megabits or more. FIG. 7 is a cross sectional profile of a film deposited by the conventional sputtering apparatus of FIG. 6. As can be seen from FIG. 7, when conventional sputtering apparatuses are used, a film is deposited only at the bottom section of a hole or groove 500 in a substrate 50, so that bottom coverage is very low (expressed as b/a, with "a" denoting the thickness of the film at the top and "b" denoting the thickness of the film at the bottom).

Collimation sputtering is known as a method for increasing bottom coverage by increasing the number of sputtering particles that are allowed to be vertically incident to the substrate.

Figure 8:
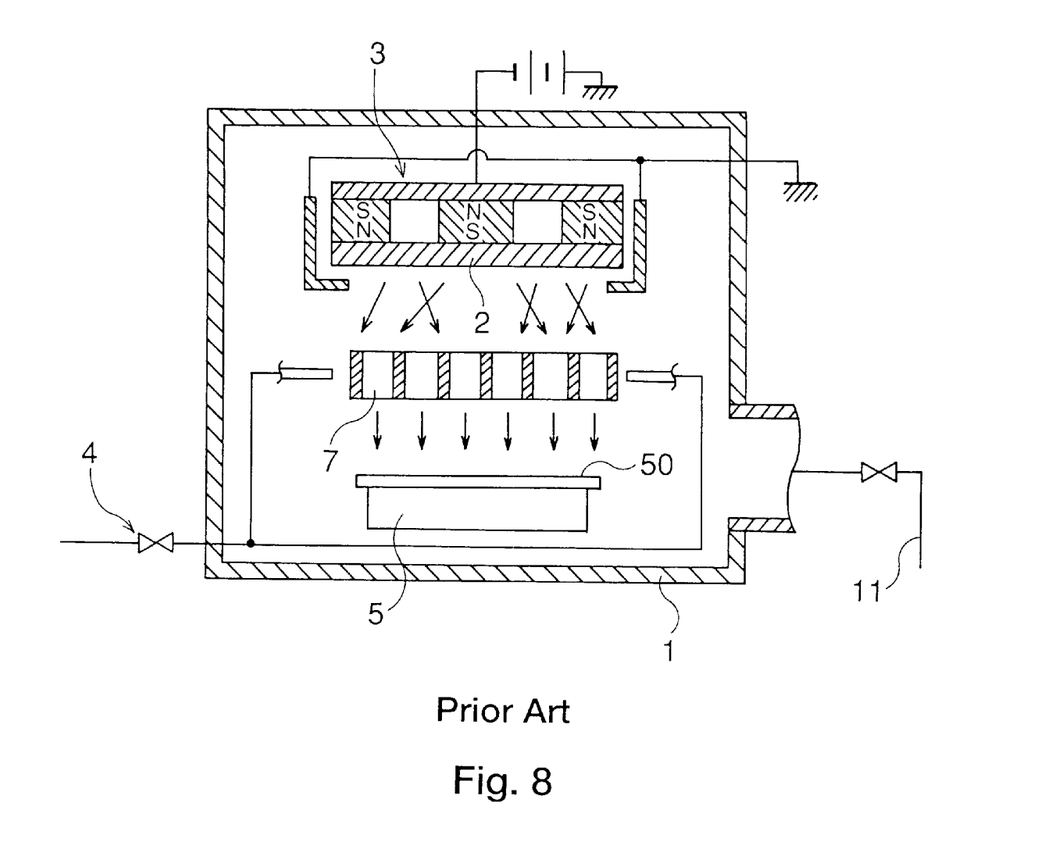
FIG. 8 is a front cross sectional view of a conventional collimation sputtering apparatus.

FIG. 8 is a front cross sectional view of a conventional sputtering apparatus that performs collimation sputtering. The sputtering apparatus of FIG. 8 has a collimation filter 7 disposed between the target 2 and the substrate 50. There are collimation filters 7 in which holes are arranged in a lattice structure, and those having a plurality of concentrically disposed ring-shaped plates. The collimation filter 7 passes only those particles travelling perpendicular to the surface of the substrate.

Collimation sputtering has a problem that when sputtering is continued for a long period of time, the cross sectional area of the passage in the collimation filter 7 becomes smaller because the sputtering particles stick to and accumulate on the collimation filter 7. A smaller cross-sectional area passage allows less sputtering particles to pass through the collimation filter, giving rise to the problem of a reduced deposition rate. This problem is considered fatal for a mass-produced apparatus. In addition, the collimation filter 7 requires maintenance such as replacement or cleaning, so that the apparatus cannot provide sufficient productivity for mass production.

Long distance sputtering has been recently drawing attention as a method that makes it possible to overcome the problems occurred in collimation sputtering. FIG. 9(a) is a front cross sectional view of a conventional long distance sputtering apparatus.

As can be seen from FIG. 9(a), in the sputtering apparatus the target 2 and the substrate 50 are separated by a larger distance than usual. (The distance between the target and the substrate is hereinafter referred to as the "T/S distance"). For a longer T/S distance only those sputtering particles, among the sputtering particles ejected from the target 2, that travel nearly perpendicular to the surface of the substrate 50 reach the substrate 50. Those particles that travel obliquely to the surface of the substrate 50 move toward the walls of the vacuum vessel 1, as illustrated in FIG. 9(a). Accordingly, there is a relative increase in the number of sputtering particles that are allowed to be vertically incident to the surface of the substrate 50, resulting in significantly increased bottom coverage.

In the sputtering apparatus of FIG. 9(a), a shield 6 is provided inside a vacuum vessel 1 in order to reduce the number of sputtered particles sticking to the walls of the vessel 1. The shield 6 has gas-introducing holes 41 through which sputtering gas is introduced by means of a gas-introducing mechanism 4. As illustrated in FIG. 9(a), each gas-introducing hole 41 is located near the substrate holder 5, and at about 30 mm from the substrate 50.

The shield 6 has exhaust holes 42, provided near the gas-introducing holes 41, for discharging sputtering gas. More specifically, the exhaust holes 42 are located above and below the gas-introducing holes 41, where above and below are defined in the specification with respect to a line connecting the substrate 50 and the target 2.

The sputtering gas is also discharged through the space between each shield 6 and the target 2.

When the gas-introducing holes 41 and the exhaust holes 42 are disposed in this way, the pressure at locations toward the target 2 is low and the pressure at locations toward the substrate 50 is high, as can be seen by the straight line 40 indicating the pressure distribution of the sputtering gas in FIG. 9(b), as measured from the target 2 to the substrate 50.

In the above-described long distance sputtering apparatus, the T/S distance is increased and the sputtering gas pressure is decreased so that a greater number of sputtering particles are allowed to be vertically incident to the substrate, without scattering of the sputtering particles.

OBJECTS AND SUMMARY

Accordingly, an object of the invention of this application is to increase the bottom coverage, preferably doubling it, by making further use of this advantage of the long distance sputtering apparatus.

To this end, there is provided according to the present invention a sputtering apparatus in which the T/S standard value, obtained by dividing the distance between the target and the substrate by a representative target length, is preferably greater than 0.5. In addition, in order to reduce scattering of the sputtering particles that are allowed to be vertically incident to the substrate, the gas-introducing tubes and the exhaust holes are disposed in the vacuum vessel so that the pressure distribution of the sputtering gas between the target and the substrate is gradually decreased along a direction from the target toward the substrate.

More specifically, it is preferable to set the distance between the target and the substrate at 150 mm or more.

Gas-introducing tubes, which introduce sputtering gas into the space between the target and the substrate by means of a gas-introducing mechanism, are provided near a shield that surrounds the space between the target and the substrate. They are preferably disposed closer to the target than halfway between the target and the substrate. Exhaust holes, through which sputtering gas is discharged, are formed in the shield at locations preferably closer to the substrate than halfway between the target and the substrate.

In order to reduce the sputtering particles, passing through the exhaust holes, that stick onto the walls of the vacuum vessel, the path of the exhaust holes is bent. A plurality of these exhaust holes are formed in the shield along the direction of a line connecting the target and the substrate.

The pressure near the target is from 3 to 10 times greater than the pressure near the substrate. The pressure near the target is in the range of from 0.7 to 1.0 millitorr, while the pressure near the substrate is less than 0.3 milliTorr.

BRIEF DESCRIPTION OF THE DRAWINGS

FIG. 1(a) is a front cross sectional view of a first embodiment of a sputtering apparatus in accordance with the present invention, while FIG. 1(b) is a graph showing the pressure distribution between the substrate and the target in the first embodiment of the sputtering apparatus in accordance with the present invention.

DESCRIPTION OF PREFERRED EMBODIMENTS

A description will now be given of the preferred embodiments of the invention of this application.

Figure 1:
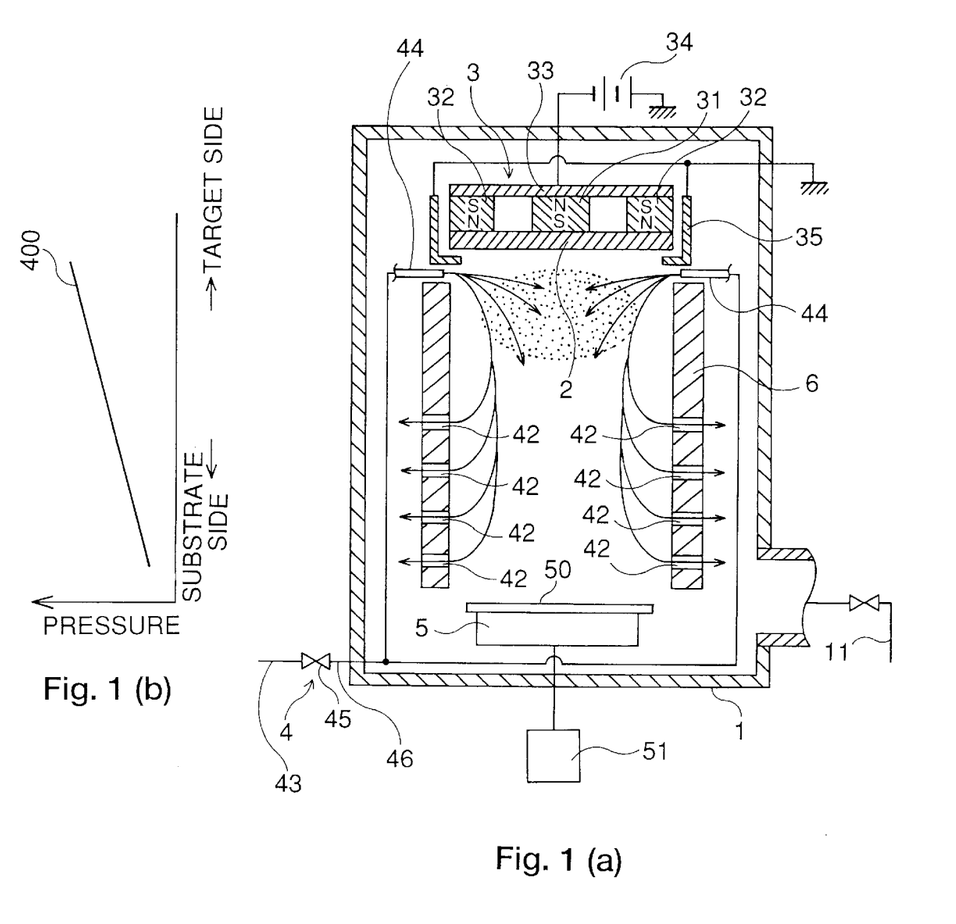

FIG. 1(a) is a front cross sectional view of a first embodiment of a long distance sputtering apparatus of the present invention. Referring to FIG. 1(a), the sputtering apparatus has a vacuum vessel that contains a target 2, a magnetron electric discharge electrode 3, and a substrate holder 5 for holding a substrate 50. The sputtering apparatus is provided with an exhaust system 11 and a gas introducing mechanism 4 for introducing sputtering gas therein.

The vacuum vessel 1 is an air-tight vessel that is provided with a gate valve (not shown), and is evacuated to a pressure of about $10^{-8}$ Torr by means of the exhaust system 11 that includes a cryogenic pump. The vessel 1 is disposed adjacent to a load lock chamber (not shown) capable of pumping down to vacuum. When the substrate 50 is transferred into or out of the vacuum vessel 1, it is transferred into the load lock chamber so that it will not be exposed to the atmosphere.

The target 2 is a circular or square-shaped flat bulk comprised of film material, and is screwed at the front face of the electrode 3. A grounded target shield 35 is placed along the periphery of the target 2 in order to prevent unwanted electric discharge from occurring near the target 2.

The electrode 3 is a cathode magnetron comprised of a pair of magnets 31, 32 disposed behind the target 2, and an electric discharge power supply 34 connected to a yoke 33 that holds the pair of magnets 31, 32. The pair of magnets 31, 32 comprises a cylindrical permanent magnet (for example, a north pole) 31 at the center and an annular permanent magnet (for example, a south pole) that surrounds the center cylindrical permanent magnet. The pair of magnets 31, 32 generates an arc-shaped magnetic field for magnetron electric discharge above the target 2. When a high negative DC voltage or high frequency voltage is applied to the electrode 3 by the electric discharge power supply 34, magnetron electric discharge occurs.

The gas-introducing mechanism 4 for introducing sputtering gas is comprised of a gas-introducing pipe line 43 that connects a gas cylinder (not shown) to the vacuum vessel 1, gas-introducing tubes 44 connected to the gas-introducing pipe line 43, a valve 45 provided at the gas-introducing pipe line 43, and a mass flow controller (not shown). Inert gas such as argon gas that has a high sputter rate is used for the sputtering gas.

The substrate holder 5 is separated from the target 2 by a T/S distance that is suitable from the technical standpoint of long distance sputtering. When the holder 5 and the target 2 are separated by a proper T/S distance, more effective bottom coverage is achieved, as described above. When the T/S standard value (T/S distance divided by a typical target length) is greater than 0.5, effective and satisfactory long distance sputtering can be achieved. Here, the length of the target 2 is its diameter when it is circular, and the length f the longer side when it is rectangular.

The substrate 50 held by the substrate holder 5 is disposed opposite to and parallel to the target 2. Its center point and the center point of the target 2 is on the same straight line. This straight line will hereunder be referred to as the central axis.

There are cases when a bias voltage is applied to the substrate 50. Therefore, a bias voltage power supply is connected to the substrate holder 5. When the temperature of the substrate 50 is to be controlled, a heater is built into the substrate holder 5, or the holder 5 is constructed such that a heating medium or a cooling medium circulates in the holder 5. To transfer the substrate 50 in and out of the vessel, a mechanism 51 for moving the substrate holder 5 up and down is provided.

A shield 6 is disposed so as to surround the space between the target 2 and the substrate holder 5 in order to reduce the number of sputtering particles sticking to the walls of the vacuum vessel 1. The shield 6 is substantially a cylindrical member having a length of 300 mm and a diameter of 270 mm removably mounted in the vacuum vessel 1 by fixtures (not shown). The shield 6 is subjected to blasting treatment to enhance its film adhesion strength, so as to prevent the films accumulated on the shield 6 from peeling off and falling onto the substrate 50.

A characteristic of the apparatus in the present embodiment is the pressure distribution of sputtering gas in the space between the target 2 and the substrate 50, in which the pressure is higher at locations toward the target 2, and lower at locations toward the substrate 50.

The pressure distribution is greatly affected by the arrangement of the gas-introducing tubes 44, and the exhaust holes 42.

As illustrated in FIG. 1(a), the gas-introducing tubes 44 are disposed in the narrow space between the shield 6 and the target shield 35. The tubes 44 introduce the gas from their open ends toward the space in front of the target 2. The tubes 44 are separated from the target 2 by a distance of about 200 mm to 400 mm, as viewed in the direction of the central axis. In a preferred embodiment, eight gas-introducing tubes 44 are disposed at equal intervals so as to surround the space in front of the target 2, with their openings at their front ends facing the central axis. The tubes 44 eject the sputtering gas uniformly toward the central axis. The tubes 44 are also connected to a supply tube 46 that passes through the wall of the vacuum vessel 1 in an air-tight manner in order to be connected to the gas-introducing pipe line 43.

As illustrated in FIG. 1(a), slit-shaped exhaust holes 42, about 5 mm to 20 mm wide, are formed at portions of the shield 6 near the substrate 50. In a preferred embodiment, thirty-six exhaust holes 42 are disposed at equal distances apart along the peripheral dimension of the cylindrical shield 6. The exhaust holes 42 are formed in four levels that are equal distances apart, as viewed in the direction of the central axis. The exhaust holes 42 arranged in a line are separated by a distance of from 10 mm to 30 mm, as viewed in the direction of the central axis.

The sputtering gas, which is introduced from the gas-introducing tubes 44 to the area in front of the target 2, causes magnetron electric discharge to generate on the target 2. The sputtering gas diffuses toward the substrate 50, after which it is discharged through the exhaust holes 42.

The pressure distribution of sputtering gas in the space between the target and the holder in this manner is established as represented by a straight line 400 in the graph of FIG. 1(b). The straight line 400 shows that the pressure progressively decreases as the sputtering gas flows toward the substrate 50.

In order to obtain a pressure distribution represented by the straight line 400, the mass flow of the gas to be introduced and the exhaust conductance of the exhaust holes 42 must be taken into account, in addition to the arrangement of the gas-introducing tubes 44 relative to the exhaust holes 42.

For example, if the mass flow of the gas is high, but the exhaust conductance of the exhaust holes is small, the gas uniformly fills the space within the shield 6, as a result of which the pressure distribution in the direction of the central axis does not change. If, on the other hand, the mass flow of the gas is small, but the exhaust conductance of the exhaust holes 42 is large, the gas diffuses in the space within the shield 6 in a diluted state, so that the pressure distribution remains constant at low values. Therefore, in order to obtain the pressure distribution represented by the straight line 400, it is essential to properly set the mass flow of the gas from each gas-introducing tube and the exhaust conductance of each exhaust hole 42 to proper values.

When gas-introducing holes are formed in the shield 6 in order to introduce gas, the distance between the opening for introducing gas and the substrate is set such that the T/S standard value is 0.5 or more.

An additional description will be given of the positional relationship between the gas-introducing tubes 44 and the exhaust holes 42.

In order to establish the aforementioned pressure distribution it is preferable that the gas-introducing tubes 44 are disposed closer to the target 2 than halfway between the target 2 and the substrate 50. In addition, it is preferable to place the gas-introducing tubes 44 such that gas can be introduced to the extent possible from a region near the target. More specifically, it is preferable that an end of each of the gas introducing tubes 44 be set at a distance ranging from 0 mm to 30 mm from an edge of the target 2, as viewed in a direction perpendicular to the central axis.

Further, in order to establish the aforementioned pressure distribution, it is preferable to form each exhaust hole 42 closer to the substrate 50 than halfway between the target 2 and the substrate 50, such as to allow in the space between the substrate 50 and the target 2 an exhaust conductance to be set on the surface of the substrate 50. The aforementioned pressure distribution cannot be obtained merely by connecting an exhaust duct to a wall of the vacuum vessel 1 at the back side of the substrate 50.

A description will now be given of the operation of the entire long distance sputtering apparatus of the present embodiment.

When a gate valve (not shown) is opened, the substrate 50 is transferred into the vacuum vessel 1 by a transferring robot (not shown), passes near the lower end of the shield 6, and arrives at a predetermined position above the substrate holder 5. The substrate holder 5 is lifted upward by means of the mechanism 51 below the substrate holder 5, in order to hold the substrate 50.

The gas-introducing mechanism 4 then operates to introduce sputtering gas into the space between the target 2 and the substrate 50 via the gas-introducing tubes 44. The introduced sputtering gas disperses from the region in front of the target 2 toward the substrate 50, and the application of voltage to the electrode 3 causes magnetron electric discharge to be generated at the target 2. The magnetron electric discharge causes the sputtering gas to be ionized. The ionized gas molecules are sputtered onto the target 2. The particles that have been sputtered onto the target 2 (hereinafter referred to as "sputtering particles") travel through the space between the target 2 and the substrate 50 and arrive at the substrate 50, where they accumulate to deposit a film. When a film of a desired thickness is deposited, the application of voltage is stopped, and the substrate 50 with a film deposited thereon is transferred out the vacuum vessel 1.

Figure 2:
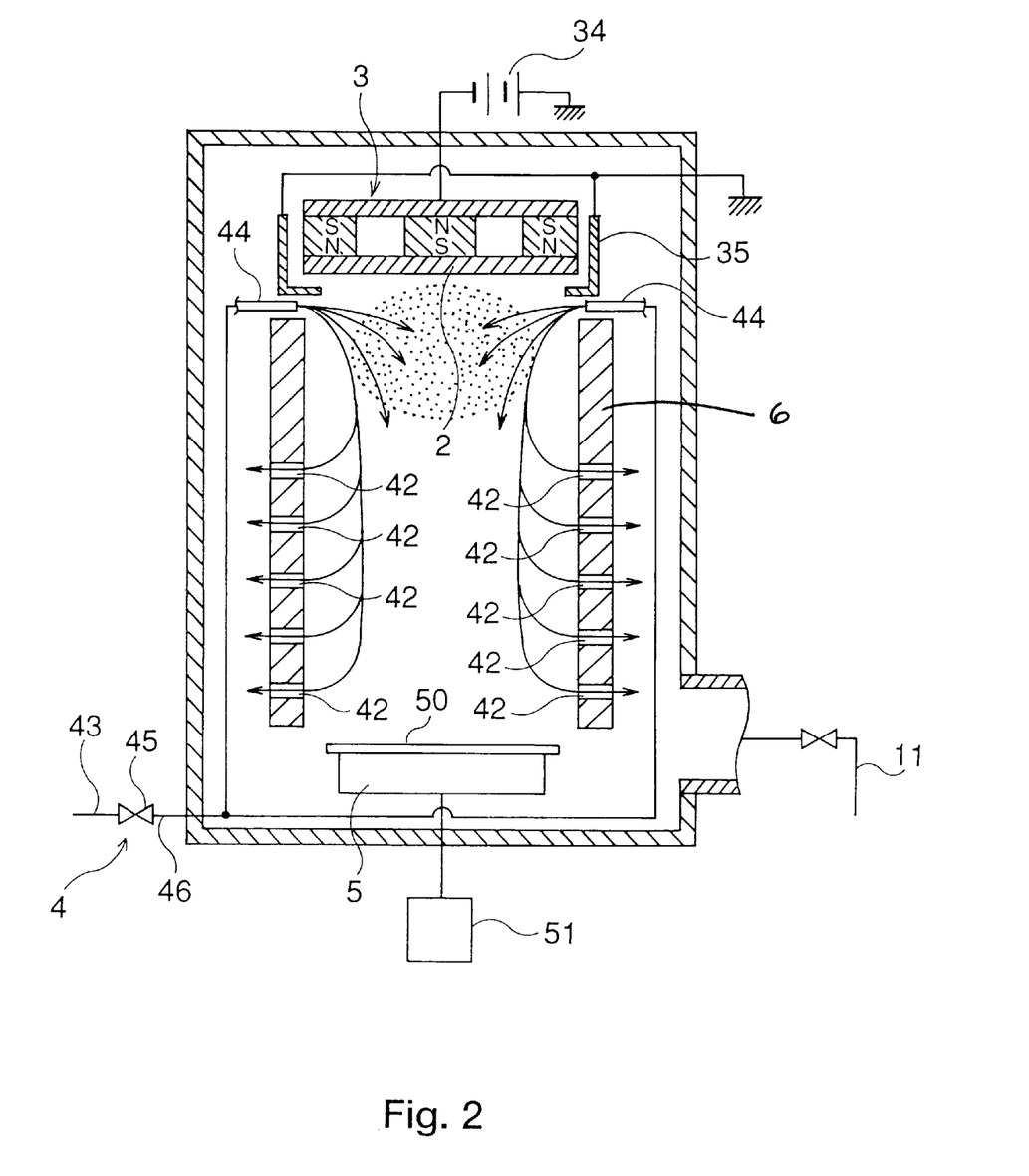
FIG. 2 is a front cross sectional view of a second embodiment of a sputtering apparatus in accordance with the present invention.

A simple description will now be given of a second embodiment of the present invention. The long distance sputtering apparatus of the second embodiment is illustrated in FIG. 2. The difference between the long distance sputtering apparatus of the first embodiment with the sputtering apparatus of the second embodiment is that the exhaust holes 42 are formed in five levels, instead of four, along the peripheral dimension of the shield 6. Other details of the construction of the sputtering apparatus of the second embodiment are essentially the same as those of the sputtering apparatus of the first embodiment.

When the T/S distance becomes greater than 150 mm, the sputtering apparatus provides excellent bottom coverage, which is a technical advantage thereof, so that a film of an adequate thickness is deposited. In the sputtering apparatuses of the embodiments, pressure distribution is characterized by a higher sputtering gas pressure at regions toward the target 2 side and lower sputtering gas pressure at regions toward the substrate 50 side. Therefore, superior bottom coverage can be provided, with the bottom coverage being twice that of conventional long distance sputtering apparatuses.

This increase in bottom coverage will be further described with reference to the graph of FIG. 3.

Figure 3:
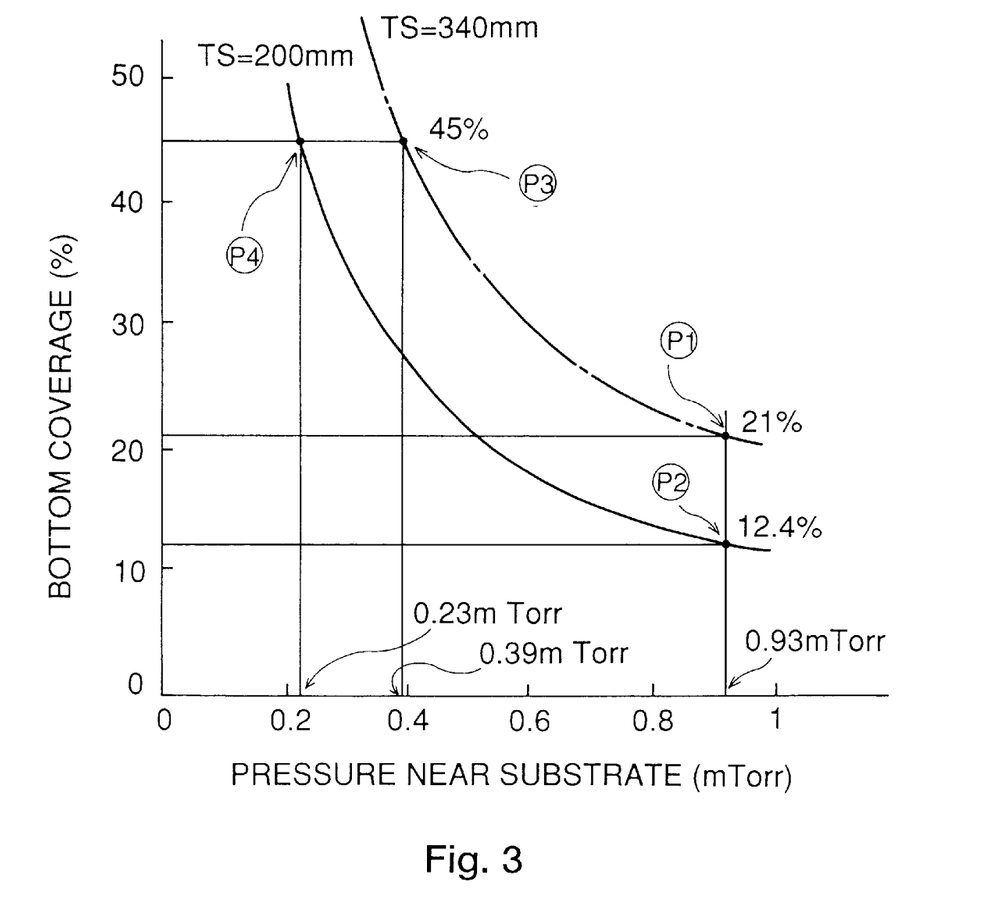
FIG. 3 is a graph showing the dependence of bottom coverage on the pressure near the substrate.

FIG. 3 is a graph showing the dependence of bottom coverage on the pressure near the substrate for the sputtering apparatuses of each embodiment and for the conventional sputtering apparatus. In the graph, the horizontal axis indicates the pressure near the substrate 50, while the vertical axis indicates the bottom coverage. The pressure values on the graph are those measured at a point about 30 mm above the substrate 50. Bottom coverage is the ratio (by percent) of the film thickness at the bottom of a hole or groove to the film thickness on the top of the substrate, as described above.

Figure 9:
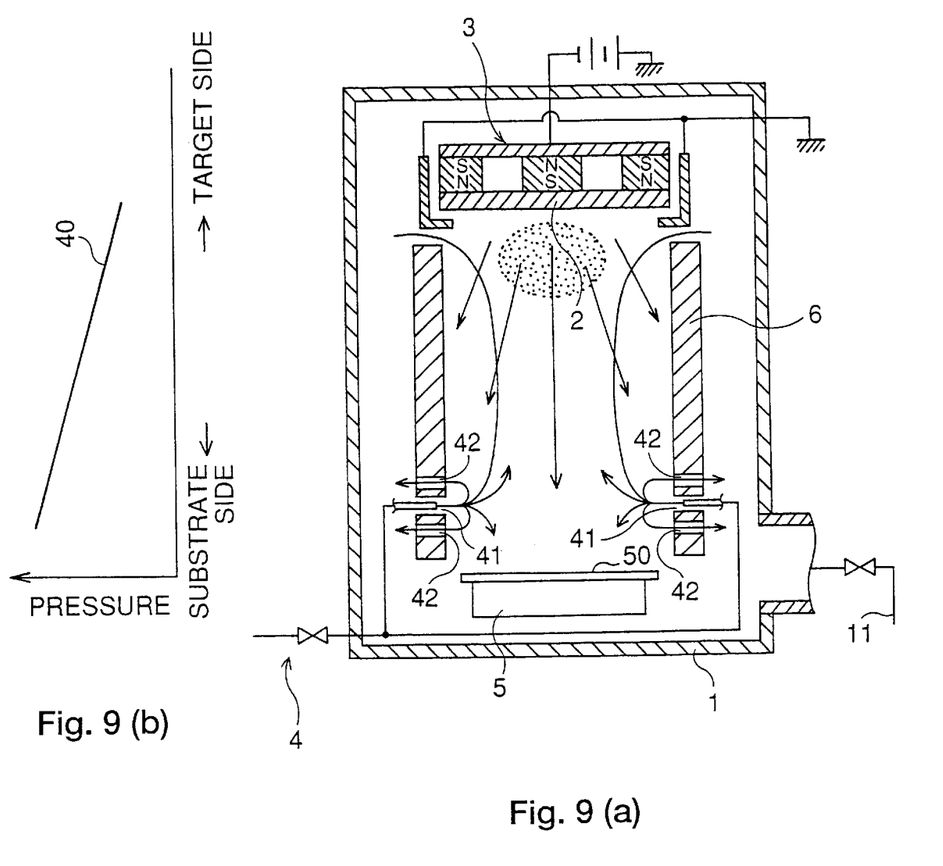
FIG. 9(a) is a front cross sectional view of a conventional long distance sputtering apparatus.
FIG. 9(b) is a graph showing the pressure distribution between the substrate and the target in the conventional long distance sputtering apparatus.

In the conventional sputtering apparatus of FIG. 9(*a*), the T/S distances are set at 200 mm and 340 mm. In the sputtering apparatus of the first embodiment, the T/S distance is preferably set at 340 mm, while in the sputtering apparatus of the second embodiment, the T/S distance is preferably set at 200 mm. The sputtering gas used is argon gas which is introduced into the vacuum vessel at a mass flow of 10 SCCM. The pumping rate of the exhaust system 11 is about 1000 liters per second.

In FIG. 3, in the conventional sputtering apparatus, Point P1 and Point P2 are points where a line drawn from the bottom coverage value on the vertical axis and a line drawn from the pressure near the substrate on the horizontal axis meet, when the T/S distance is 340 mm and 200 mm, respectively. For the sputtering apparatus of the first embodiment with a T/S distance of 340 mm, Point P3 is a point where a line drawn from the bottom coverage value on the vertical axis and a line drawn from the pressure value on the horizontal axis meet. For the sputtering apparatus of the second embodiment with a T/S distance of 200 mm, Point P4 is a point where a line drawn from the bottom coverage value on the vertical axis and a line drawn from the pressure value near the substrate on the horizontal axis meet.

From the points P1 and P2 in the graph of FIG. 3, when T/S distances in the conventional sputtering apparatus were 200 mm and 340 mm, the pressure at a point about 30 mm from the substrate 50 was about 0.93 mTorr in both cases. When the T/S distance was 200 mm, bottom coverage was 12.4%. When the T/S distance was 340 mm, bottom coverage was 21.0%.

On the other hand, from P3 and P4, at a point about 30 mm from the substrate 50, the pressure was 0.39 mTorr for the sputtering apparatus of the first embodiment when the T/S distance was 340 mm, while the pressure was 0.23 mTorr for the sputtering apparatus of the second embodiment when the T/S distance was 200 mm. In both embodiments, bottom coverage was 45%.

The graph shows that when the pressure near the substrate 50 is low, bottom coverage is at least doubled. Bottom coverage is improved because a reduced pressure near the substrate 50 decreases the number of sputtering gas molecules that scatter the sputtering particles near the substrate 50.

The sputtering apparatus of the second embodiment with a T/S distance of 200 mm has lower pressure near the substrate 50 compared to the sputtering apparatus of the first embodiment with a T/S distance of 340 mm. This is because the sputtering apparatus of the second embodiment has higher exhaust conductance than the sputtering apparatus of the first embodiment because it has one more exhaust hole 42 level, as shown in FIG. 2.

The conductance of the conventional apparatus is 1064 liters per second. In the conventional apparatus, the exhaust holes 42 are slits with a width of about 5 mm, and are each formed above and below the gas-introducing tubes 44. The distance between the upper exhaust hole 42 and the target 2 is 200 mm; the distance between the lower exhaust hole 42 and the substrate 50 is 100 mm; and the interval between the upper and lower exhaust holes is 40 mm.

The exhaust conductance of the shield 6 of the sputtering apparatuses of the first and second embodiments are 2275 liters per second and 3749 liters per second, respectively. The exhaust holes 42 of the apparatuses are slit-shaped, with a width of 10 mm and a depth of 20 mm, which is equal to the thickness of the shield 6. In the sputtering apparatus of the first embodiment, the topmost exhaust hole 42 is separated from the target 2 by a distance of 100 mm, the bottommost exhaust hole 42 is separated from the substrate 50 by a distance of 50 mm, and the interval between each exhaust hole level is 30 mm. In the sputtering apparatus of the second embodiment, the topmost exhaust hole 42 is separated from the target 2 by a distance of 200 mm, the bottommost exhaust hole 42 is separated from the substrate 50 by a distance of 20 mm, and the interval between the exhaust holes 42 of each level is 20 mm.

In the sputtering apparatuses of the first and second preferred embodiments, sputtering gas is introduced from the region near the target 2, and the space near the substrate 50 is evacuated with a high conductance through the exhaust holes 42 formed at a plurality of levels. Thus, the sputtering gas pressure near the target 2 is kept at a high level, while the sputtering gas pressure near the substrate 50 is kept at a low level. Such a pressure distribution makes it possible to stably maintain the magnetron electric discharge and achieve film deposition with excellent bottom coverage.

In the long distance sputtering apparatus, the bottom coverage is further improved either by increasing the T/S distance or by further reducing the gas pressure near the substrate 50 in order to increase the number of sputtering particles that are allowed to be vertically incident to the surface of the substrate. However, an increase in the T/S distance reduces the sputter rate and increases the size of the apparatus. On the other hand, a reduction in the gas pressure during the magnetron electric discharge causes the magnetron electric discharge state to become unstable.

In the conventional long distance sputtering apparatus of FIG. 9(*a*), bottom coverage can be further improved only by either increasing the T/S distance or reducing the gas pressure during the magnetron electric discharge, thus giving rise to the same problems as those described above.

In order to achieve excellent bottom coverage while maintaining the stability of the sputtering electric discharge, it is generally preferable that the pressure near the target 2 be set to about 3 to 10 times the pressure near the substrate 50. When the pressure near the target 2 is less than 3 times the pressure near the substrate SO, both excellent stability of the magnetron electric discharge and satisfactory bottom coverage cannot be achieved at the same time. When the pressure near the target 2 is more than 10 times the pressure near the substrate 50, it becomes extremely difficult to realize the desired gas-introducing and exhausting constructions.

The pressure value depends on the voltage and the required deposition rate. Therefore, definite pressure values cannot be given. However, in the present embodiment, it is preferable that the pressure near the target 2 be in the range of about 0.7 to 1 mTorr for a stable electric discharge, and that the pressure near the substrate 50 be not more than 0.3 Mtorr for improving bottom coverage. When the pressure near the target 2 is less than 0.7 mTorr, a stable electric discharge is difficult to maintain. On the other hand, a pressure of more than 1 mTorr gives rise to the problems of scattering of the sputtering particles due to the sputtering gas molecules and mixing of the sputtering gas molecules in the film. When the pressure near the target 2 is more than 0.3 mTorr, satisfactory bottom coverage is difficult to obtain due to scattering of the sputtering particles.

The meaning of "near the target" and "near the substrate" will be given.

The phrase "near the target" refers to the area of space where ions and electrons necessary for maintaining magnetron electric discharge are present. How far "near" is from the target depends on the manner of electric discharging, so that definite distances cannot be given as to how far "near" is from the target. In the case of magnetron electric discharge, "near" means the area of space where the electric discharge is confined, formed in front of the target by arc-shaped magnetic lines of force. In the present embodiment, "near" means a distance of about 10 to 40 mm from the target.

The phrase "near the substrate" refers to the area of space that affects the bottom coverage due to the collisions of the sputtering particles with the sputtering gas molecules. How far the area of space can be and still have an affect on the directions from which the sputtering particles are directed towards the substrate depends on the T/S distance, so that a definite distance cannot be given. However, in the present embodiment, "near the substrate" means a distance extending from about 10 to 100 mm from the substrate.

Figure 4:
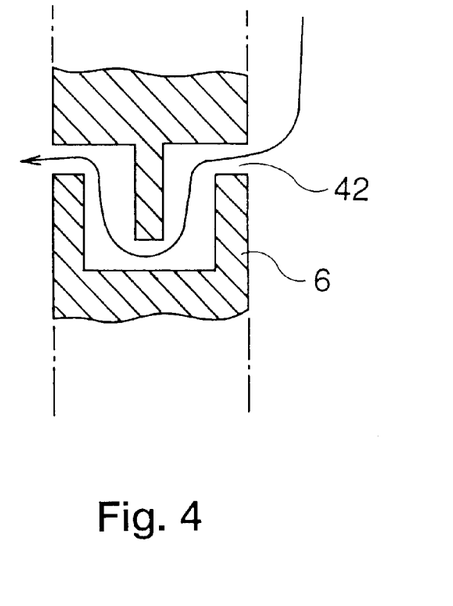
FIG. 4 is an enlarged cross sectional view of an exhaust hole.

FIG. 4 is an enlarged cross sectional view of an exhaust hole 42 that is formed in the shield 6 that reduces the number of sputtering particles sticking to the walls of the vacuum vessel 1. The sputtering particles pass through the exhaust hole 42 and stick onto the walls of the vessel 1.

In this case, when the path of the exhaust hole 42 is formed as illustrated in FIG. 4, the path of sputtering particles is bent, so that the number of particles that travel outside the shield 6 is reduced. The exhaust path can be formed so as to obtain the required exhaust conductance, since the conductance is reduced when the exhaust path is bent.

Figure 5:
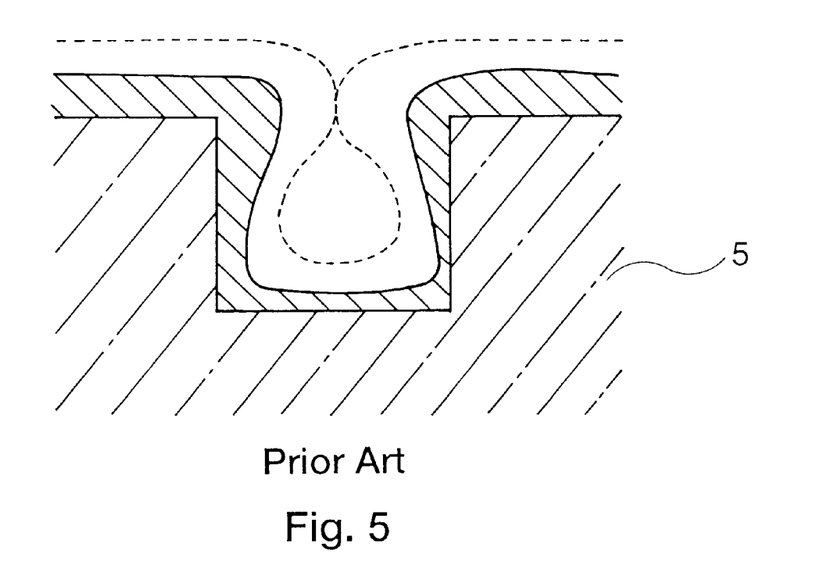
FIG. 5 is a cross sectional profile of a film deposited in a hole.

FIG. 5 is a cross sectional profile of a film deposited in the hole in the surface of the substrate.

When a film is deposited in a hole by filling particles therein but the film deposited at the corners of the bottom and side faces of the hole is not thick enough, the film grows as illustrated by the dotted lines of FIG. 5, creating a void in the hole. The void increases the electrical current density, which significantly increases the wiring resistance. Therefore, it is necessary to increase the deposition rate at the bottom corners of the hole, so that a void is not formed.

This can be achieved by the sputtering apparatuses of the embodiments of the present invention, in which a film of sufficient size is deposited at the bottom corners of the hole, so that proper wiring can be achieved without the formation of a void.

Excellent bottom coverage is also achieved when the wiring formed at a stepped section is properly covered with an interlayer insulation film, so that the required flatness is achieved.

In order to realize a higher pressure at locations toward the target and a lower pressure at locations toward the substrate, the size of the exhaust hole 42 formed near the substrate can be made large to increase the conductance at some locations near the substrate 50 to a high value, while the exhaust holes 42 are disposed at an equal interval between the target 2 and the substrate 50. Or, the exhaust holes 42 of the same size can be arranged such that the interval between the exhaust holes 42 gets smaller the closer they are to the substrate 50.

When no shield 6 is provided, the gas-introducing tubes 44 and the exhaust holes 42 are directly provided in the walls of the vessel 1.

In the pressure distribution in which the pressure is high toward the target and low toward the substrate, changes may take place gradually in a curvilinear fashion or in steps.

The exhaust holes 42 may be formed into a variety of shapes, such as spherical or square shapes. When the exhaust holes 42 are slit-shaped holes that extend in the peripheral direction, the slits may measure 360 degrees or be divided into a plurality of slit sections that are formed along the peripheral direction and separated by equal intervals. In the case of a 360 degree slit, fixtures may be provided for the shield 6 because the shield is divided in the direction of the central axis.

As can be understood from the foregoing description, according to the present invention, it is possible to deposit a film that sufficiently covers a deep hole or the bottom of a groove, because the bottom coverage is at least twice that of conventional long distance sputtering apparatuses. Accordingly, the present invention provides a long distance sputtering apparatus that is suitable for use in the film deposition step performed when producing a 256-megabit integrated circuit, with a line width of 0.25 $\mu$m.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A sputtering apparatus comprising:
   a vacuum vessel provided with an exhaust system;
   a target;
   a magnetron cathode for generating magnetron electric discharge;
   a substrate holder for holding a substrate, wherein a T/S distance is defined by a distance between the substrate and the target; and
   a gas-introducing mechanism for introducing sputtering gas into said vacuum vessel, the gas-introducing mechanism including a gas introducing tube located at a location closer to the target than halfway between the target and the substrate;
   wherein a T/S standard value, being the T/S distance divided by a representative target length, is set at 0.5 or more; and wherein the gas-introducing tube and an exhaust hole are disposed in said vacuum vessel such that a pressure distribution of the sputtering gas between said target and said substrate is decreased substantially uniformly along a direction from said target to said substrate.

2. A sputtering apparatus according to claim 1, wherein the distance between said target and said substrate is at least 150 mm.

3. The sputtering apparatus according to claim 1, further comprising:
    a shield that surrounds a space between said target and said substrate,
    the gas-introducing tube introduces the sputtering gas into the space between said target and said substrate, and
    said shield including the exhaust hole for discharging the sputtering gas out of the space.

4. A sputtering apparatus according to claim 3, further comprising a plurality of exhaust holes that are disposed in said shield along a direction of a line connecting said target and said substrate.

5. A sputtering apparatus according to claim 3, wherein the target is a single flat plate.

6. A sputtering apparatus according to claim 1, wherein said exhaust hole has an exhaust path that is bent.

7. A sputtering apparatus according to claim 1, wherein the target is a single flat plate.

8. A sputtering apparatus according to claim 1, wherein substantially all of the target is directly exposed to the substrate.

9. A sputtering apparatus according to claim 1, wherein the space between the target and the substrate is substantially open.

10. The sputtering apparatus according to claim 1, wherein the pressure distribution is decreased linearly along the direction from said target to said substrate.

11. The sputtering apparatus according to claim 1, including means for providing a pressure at the target of about 3 to 10 times a pressure at the substrate.

12. The sputtering apparatus according to claim 11 wherein the sputtering gas pressure near said target is in the range of from 0.7 to 1.0 millitorr, while the sputtering gas pressure near said substrate is 0.3 millitorr or less.

13. A sputtering apparatus comprising:
    a vacuum vessel provided with an exhaust system;
    a target;
    a magnetron cathode for generating magnetron electric discharge;
    a substrate holder for holding a substrate, wherein a T/S distance is defined by a distance between the substrate and the target; and
    a gas-introducing mechanism for introducing sputtering gas into said vacuum vessel, the gas-introducing mechanism includes a gas introducing tube located at a location closer to the target than halfway between the target and the substrate and means for providing a pressure at the target of about 3 to 10 times a pressure at the substrate;
    wherein a T/S standard value, being the T/S distance divided by a representative target length, is set at 0.5 or more; and
    wherein the gas-introducing tube and an exhaust hole are disposed in said vacuum vessel such that a pressure distribution of the sputtering gas between said target and said substrate is decreased along a direction from said target to said substrate.

14. The sputtering apparatus according to claim 13, wherein the pressure distribution is decreased substantially uniformly along the direction from said target to said substrate.

15. The sputtering apparatus according to claim 13, wherein the pressure distribution is decreased linearly along the direction from said target to said substrate.

16. The sputtering apparatus according to claim 13, further comprising:
    a shield that surrounds a space between the target and the substrate;
    an exit of the gas introducing tube is arranged in a space between the target and the shield; and
    the shield includes exhaust holes for discharging the sputtering gas out of the space.

17. A sputtering apparatus comprising:
    a vacuum vessel provided with an exhaust system;
    a target;
    a magnetron cathode for generating magnetron electric discharge;
    a substrate holder for holding a substrate; and
    a gas-introducing mechanism for introducing sputtering gas into said vacuum vessel and a means for providing a pressure near the target of about 3 to 10 times a pressure near the substrate;
    wherein a T/S standard value, being the distance between said target and said substrate divided by a representative target length, is set at 0.5 or more; and
    wherein a gas-introducing tube and an exhaust hole are disposed in said vacuum vessel such that a pressure distribution of the sputtering gas between said target and said substrate is decreased along a direction from said target to said substrate.

18. The sputtering apparatus according to claim 17, wherein the pressure distribution is decreased substantially uniformly along the direction from said target to said substrate.

19. The sputtering apparatus according to claim 17, wherein the pressure distribution is decreased linearly along the direction from said target to said substrate.

20. The sputtering apparatus according to claim 17, further comprising:
    a shield that surrounds a space between the target and the substrate;
    an exit of the gas introducing tube is arranged in a space between the target and the shield; and
    the shield includes exhaust holes for discharging the sputtering gas out of the space.

* * * * *